United States Patent
Mehta et al.

[19]

[11] Patent Number: 5,821,775
[45] Date of Patent: Oct. 13, 1998

[54] METHOD AND APPARATUS TO INTERFACE MONOTONIC AND NON-MONOTONIC DOMINO LOGIC

[75] Inventors: Gaurav G. Mehta, San Jose; David Harris, Stanford; S. Deo Singh, Fremont, all of Calif.

[73] Assignee: Intel Corporation, Santa Clara, Calif.

[21] Appl. No.: 774,262

[22] Filed: Dec. 27, 1996

[51] Int. Cl.$^6$ .............................................. H03K 19/096
[52] U.S. Cl. ............................. 326/98; 326/121; 326/97
[58] Field of Search .................... 326/93–98, 121

[56] References Cited

U.S. PATENT DOCUMENTS

| | | | |
|---|---|---|---|
| 3,601,627 | 8/1971 | Booher | 326/97 |
| 4,827,160 | 5/1989 | Okano | 326/97 |
| 4,849,658 | 7/1989 | Iwamura et al. | 326/93 |
| 5,378,942 | 1/1995 | Wu et al. | 326/97 |
| 5,453,708 | 9/1995 | Gupta et al. | 362/98 |
| 5,517,136 | 5/1996 | Harris et al. . | |
| 5,638,009 | 6/1997 | Sutherland et al. | 326/83 |

OTHER PUBLICATIONS

"Flow–Through Latch and Edge–Triggered Flip–Flop Hybrid Elements", International Solid State Circuits Conference, Feb. 9, 1996, pp. 138–139.

"An X86 Microprocessor With Multimedia Extensions", International Solid State Circuits Conference, Feb. 7, 1997, pp. 172–173.

Donald Draper, et al. "*An X86 Microprocessor with Multimedia Extensions*" Proceedings From IEEE, Feb. 7, 1997, pp. 172–173.

*Primary Examiner*—Edward P. Westin
*Assistant Examiner*—Don Phu Le
*Attorney, Agent, or Firm*—Blakely, Sokoloff, Taylor & Zafman

[57] ABSTRACT

The present invention is an improved interface between monotonic and non-monotonic domino logic. A monotonic domino logic block is clocked by CLK. The last stage of the monotonic domino logic is clocked by the delayed clock, DCLK, to extend its evaluation period beyond Phase I by a brief window of time, $t_d$. The true output and the inverted output of the last stage of the monotonic domino logic block are inputs to a non-monotonic domino evaluation tree. The non-monotonic domino evaluation tree operates while an evaluation control block is ON. The evaluation control block is ON only during that extension of the evaluation period, $t_d$, for a time less than or equal to the period $t_d$. Since the output of the last stage of the monotonic logic block remains stable during this extended evaluation period, and the non-monotonic domino evaluation tree operates at most during this window of time, there is no need to use latches or use a dual rail implementation for the monotonic logic.

22 Claims, 8 Drawing Sheets

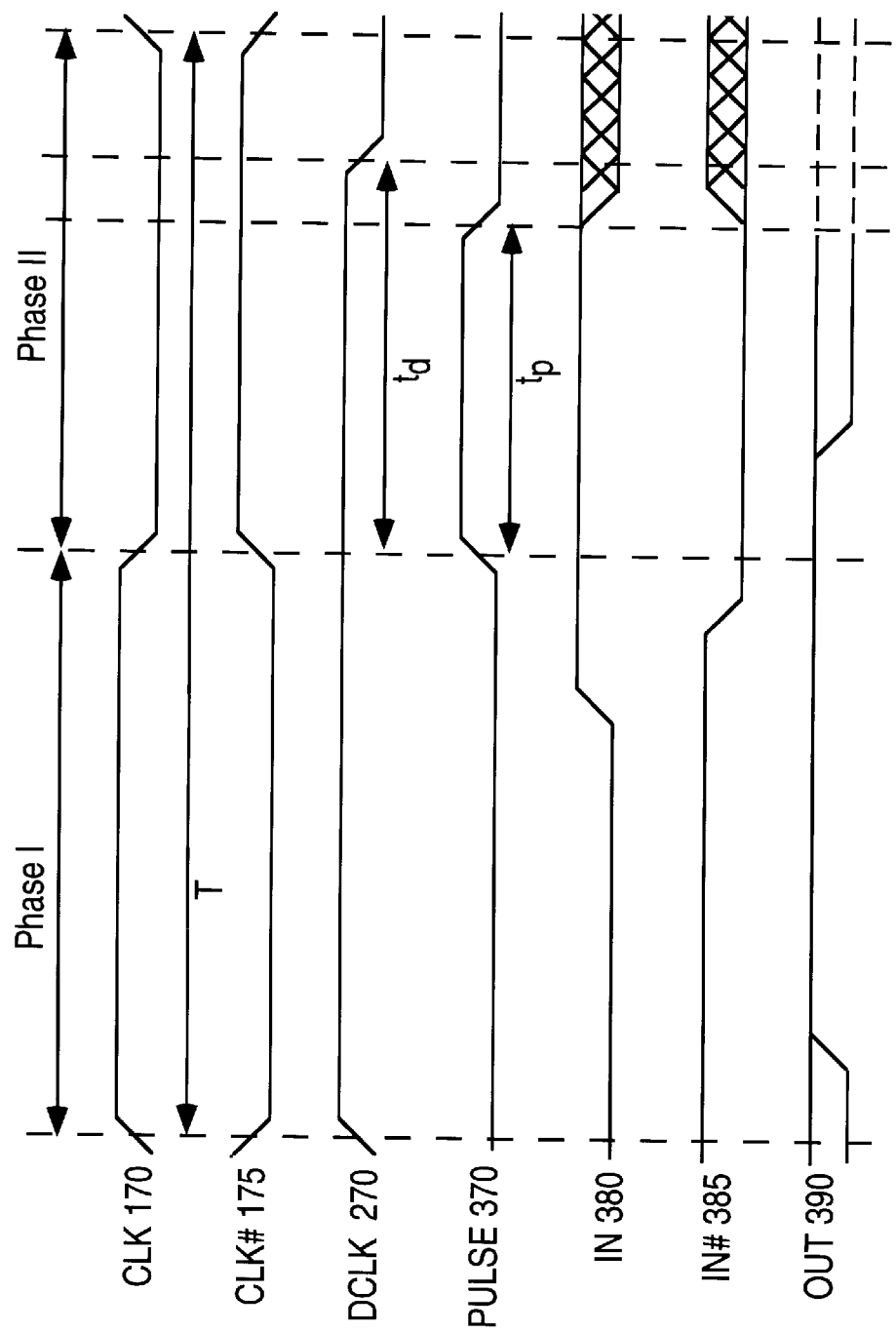

METHOD AND APPARATUS TO INTERFACE MONOTONIC AND NON-MONOTONIC DOMINO LOGIC

FIELD OF THE INVENTION

The present invention relates to digital logic circuits, and more specifically, to logic circuits designed for high-speed synchronous operation, such as domino logic circuits.

BACKGROUND OF THE INVENTION

Performance goals of processors increase in every generation, and progressively more sophisticated architectures are required to implement their complex functions. Advanced architectures require long pipelines operating at very high frequencies. These higher frequencies demand increasing usage of sophisticated circuit design styles like domino.

Domino circuits increase the speed performance of logic circuits by precharging a series of logic gates during a first clock phase, or precharge phase, and evaluating the intended logic function during the next clock phase, or evaluation phase.

One of the constraints of domino logic is that there can be no leading high to low transition or trailing low to high transition at the input to the domino logic, while the domino logic operates. A leading transition is transition that occurs when a signal stabilizes to its valid state, while a trailing transition occurs when the signal becomes invalid. Such a transition may cause an erroneous output. This constraint makes interface between normal domino logic and non-monotonic domino logic expensive in terms of performance, power and area. Non-monotonic functions simultaneously require true and complementary signals to evaluate an output. Therefore, the interface must ensure that there is no leading high to low transition or trailing low to high transition at either the true or the complementary input while the domino logic is operating.

FIG. 1A illustrates one prior art method of interfacing monotonic and non-monotonic domino logic. Domino logic block 105 is clocked by a clock signal, CLK 170. The output of domino logic block 105, IN 180, is latched by a first latch 115. The IN signal 180 is also coupled to the input of inverter 110, to generate the complementary input, IN# 182. The IN# signal 182 is latched by the second latch 120.

The IN(L) signal 185 and IN#(L) signal 188 are both input to the non-monotonic domino evaluation tree 130. By latching the output of the domino logic block 105, both latched signals, IN(L) 185 and IN#(L) 188, remain stable while the non-monotonic domino evaluation tree 130 is operating. The non-monotonic domino evaluation tree 130 is a block of non-monotonic domino logic which may be designed to implement one of a number of non-monotonic functions. For example, the non-monotonic domino evaluation tree 130 may implement a sum select in an adder. The non-monotonic domino evaluation tree 130 may optionally have inputs IN2 and IN3, or other complimentary input pairs.

The non-monotonic domino evaluation tree 130 is connected to the NMOS evaluation transistor 140, which only allows evaluation while CLK# signal 175 is high. The non-monotonic domino evaluation tree 130 is also connected to the PMOS precharge transistor 135, which pulls the OUT signal 190 high during the precharge phase, while CLK# signal 175 is low.

Further, the output of the non-monotonic domino evaluation tree 130, OUT 190, is coupled to a PMOS sustainer 150. The PMOS sustainer 150 consists of an inverter 156, with the output of the inverter 156 coupled to the gate of a PMOS device 153. This PMOS device 153 is coupled between the operating supply and the output node of the non-monotonic domino evaluation tree 130. The function of the PMOS sustainer 150 is to keep the output high—to keep it from floating—if the domino evaluation tree does not pull it low. Finally, the OUT signal 190 is an input to the Phase II domino logic block 160.

FIG. 1B represents a timing diagram of the signals used in the circuit illustrated in FIG. 1A. The CLK signal 170 is high during Phase I and low during Phase II. The CLK signal 170 clocks the domino logic block 105. The CLK# signal 175 is the complement of the CLK signal 170. The latched input signals, IN(L) 185 and IN#(L) 188, must be valid before the start of Phase II. Therefore, both IN 180 and IN# 182, must be valid at least $t_s$ prior to the end of Phase I. The time $t_s$ is the setup time of the latches 115 and 120.

The latches 115 and 120 perform no logic, but only hold a stable input for the non-monotonic domino evaluation block 130, while the non-monotonic domino evaluation block 130 evaluates during Phase II. The latches 115 and 120 add the propagation delay through the latch or the setup time of the latch to the critical path. Thus, this interface can not be used in time-critical systems. An alternative prior art interface illustrated in FIG. 2A may be implemented in such systems.

FIG. 2A is an alternative embodiment of a prior art interface between monotonic domino logic and non-monotonic domino logic, utilizing a opportunistic time borrowing (OTB) domino technique. A full description of OTB domino circuits can be found in U.S. Pat. No. 5,517, 136 issued May 14, 1996. In this technique, true and complementary inputs to the non-monotonic domino logic can not be generated using single rail implementation of the monotonic domino logic because it would cause a trailing low to high transition on one of the inputs. Therefore, the inputs must be generated by a dual-rail implementation of the monotonic domino logic, as shown in FIG. 2A.

Domino logic blocks 210A and 210B implement identical functions with complementary inputs, and thus outputs. In one embodiment, domino logic block 210A has input signals A and B, while domino logic block 210B has input signals A# and B#, the complements of signals A and B, respectively. Dlast 220A is the last logic gate in domino logic block 210A, while Dlast 220B is the last logic gate in domino logic block 210B. The domino logic blocks 210A and 210B are clocked by CLK signal 170, while Dlast 220A and 220B are clocked by a delayed version of the CLK signal 170, the DCLK signal 270. Domino 210A and 210B, including Dlast 220A and 220B, operate during a first phase of the clock signal, CLK 170. The operation of Dlast 220A and 220B is extended into Phase II, and ends at the falling edge of the DCLK signal 270.

The output of Dlast 220A is the IN signal 280, and the output of Dlast 220B is the IN# signal 285, the complement of the IN signal 280. The IN signal 280 and the IN# signal 285 are inputs to the non-monotonic domino evaluation tree 230. The non-monotonic domino evaluation tree 230 may optionally have inputs IN2 and IN#, or other complementary input pairs.

The non-monotonic domino evaluation tree 230 is connected to the NMOS evaluation transistor 240, which only allows evaluation while CLK# signal 175 is high. The non-monotonic domino evaluation tree 230 is also connected to the PMOS precharge transistor 235, which pulls the OUT signal 290 high during the precharge phase, while CLK# signal 175 is low.

The OUT signal 290 is prevented from floating by a full keeper 250. In one embodiment, the full keeper 280 includes a pair of inverters coupled in a series ring, coupled to the output node of the non-monotonic domino evaluation tree 230. The OUT signal 290 is connected to a Phase II logic block 290 evaluated during a second phase of the CLK signal 170.

FIG. 2B is a timing diagram of the clock signals utilized in the circuit of FIG. 2A. The CLK signal 170 and CLK# signal 175 are as described above with respect to FIG. 1B. The DCLK signal 270 is a delayed clock. The DCLK signal 270 has a rising edge substantially synchronous with the rising edge of the CLK signal 170, and a falling edge delayed with respect to the falling edge of the CLK signal 170. In FIG. 2B, the time delay between the falling edge of CLK signal 170 and the falling edge of the DCLK signal 270 is denoted $t_d$. The generation and use of the DCLK signal 270 is more fully described in U.S. Pat. No. 5,517,136.

The IN signal 280 and IN# 285 are low at the start of Phase I, while CLK signal 170 is high. During the operation of Dlast 220A and 220B, while DCLK signal 270 is high, only one of the of the inputs, IN 280 or IN# 285, makes a low to high transition, while the other remains low. The low to high transition must occur time te before the falling edge of DCLK signal 270. The time $t_e$ is the maximum evaluation time of the non-monotonic domino evaluation tree 230. The OUT signal 290, the output of the non-monotonic domino evaluation tree 230 becomes valid during Phase II.

Using a dual-rail implementation of the monotonic domino logic for interfacing to non-monotonic domino logic improves the performance by eliminating overhead associated with latches. However, duplicating the monotonic logic for a dual rail implementation is very costly in terms of area as well as power consumption.

Therefore what is needed is an interface between monotonic and non-monotonic domino logic without the cost in area and power consumption of a dual rail implementation or the overhead of latches.

BRIEF SUMMARY OF THE INVENTION

The present invention is an improved interface between monotonic and non-monotonic domino logic. A monotonic domino logic block is clocked by CLK. The last stage of the monotonic domino logic is clocked by a delayed clock, DCLK, to extend its evaluation period beyond Phase I by a brief window of time, $t_d$. The true output and the inverted output of the last stage of the monotonic domino logic block are inputs to a non-monotonic domino evaluation tree. The non-monotonic domino evaluation tree operates while an evaluation control block is ON. The evaluation control block is ON only during that extension of the evaluation period, $t_d$, for a time less than or equal to the period $t_d$.

Since the output of the last stage of the monotonic logic block remains stable during this window of time, and the non-monotonic domino evaluation tree operates at most during this window of time, there is no need to use latches or use a dual rail implementation for the monotonic logic.

BRIEF DESCRIPTION OF THE DRAWINGS

The present invention is illustrated by way of example, and not by way of limitation, in the figures of the accompanying drawings in which:

FIG. 3B is a timing diagram of the signals for the circuit illustrated in FIG. 3A.

DETAILED DESCRIPTION OF THE PREFERRED EMBODIMENT

A method and apparatus for interfacing between monotonic and non-monotonic domino circuits is described. In the following description, for the purposes of explanation, numerous specific details are set forth in order to provide a thorough understanding of the present invention. It will be apparent however, to one skilled in the art that the present invention may be practiced without these specific details. In other instances, well-known structures and devices are shown in block diagram form in order to avoid obscuring the present invention.

The present invention is an improved interface between monotonic and non-monotonic domino logic. A monotonic domino logic block is clocked by CLK. The last stage of the monotonic domino logic is clocked by the delayed clock, DCLK signal 270, to extend its evaluation period beyond Phase I by a brief window of time, $t_d$. The true output and the inverted output of the last stage of the monotonic domino logic block are inputs to a non-monotonic domino evaluation tree. The non-monotonic domino evaluation tree operates while an evaluation control block is ON. The evaluation control block is ON only during that extension of the evaluation period, $t_d$, for a time less than or equal to the period $t_d$. Since the output of the last stage of the monotonic logic block remains stable during this window of time, while the non-monotonic domino evaluation tree operates, there is no need to use latches or use a dual rail implementation for the monotonic logic.

Figure 1A:
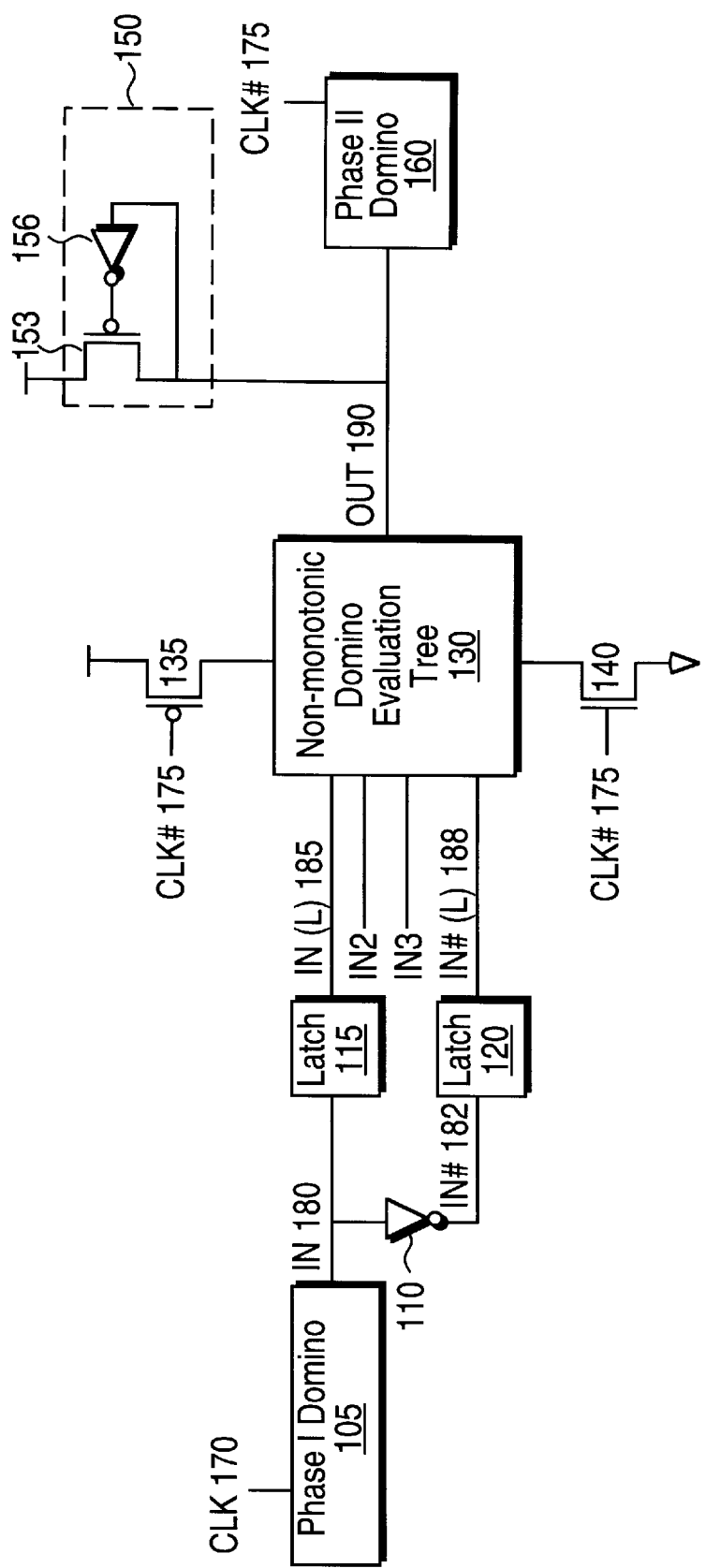
FIG. 1A is a block diagram of a prior art implementation of an interface from a monotonic to a non-monotonic domino logic function.
Figure 1B:
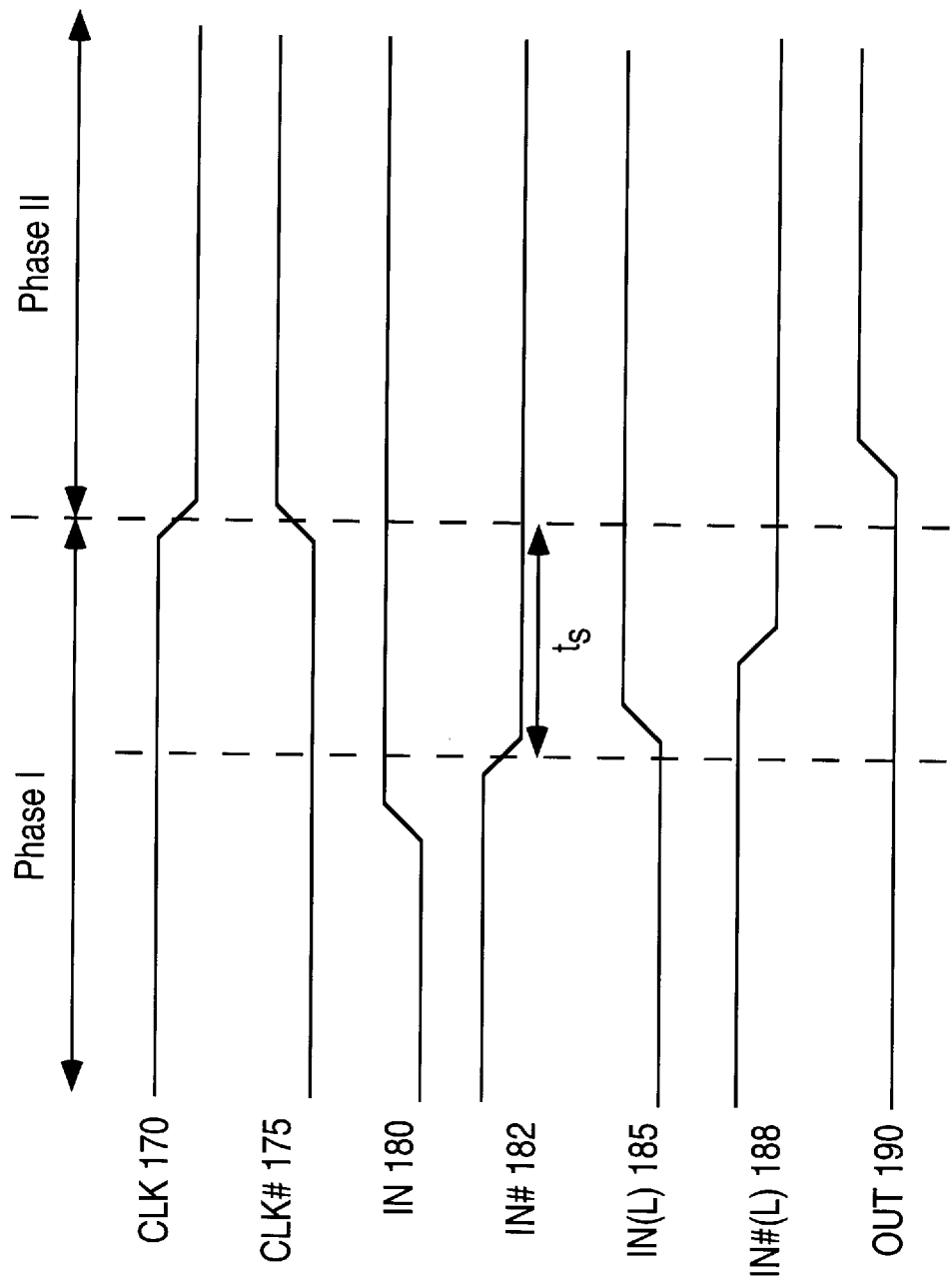
FIG. 1B is a timing diagram of the signals for the circuit illustrated in FIG. 1A.
Figure 2A:
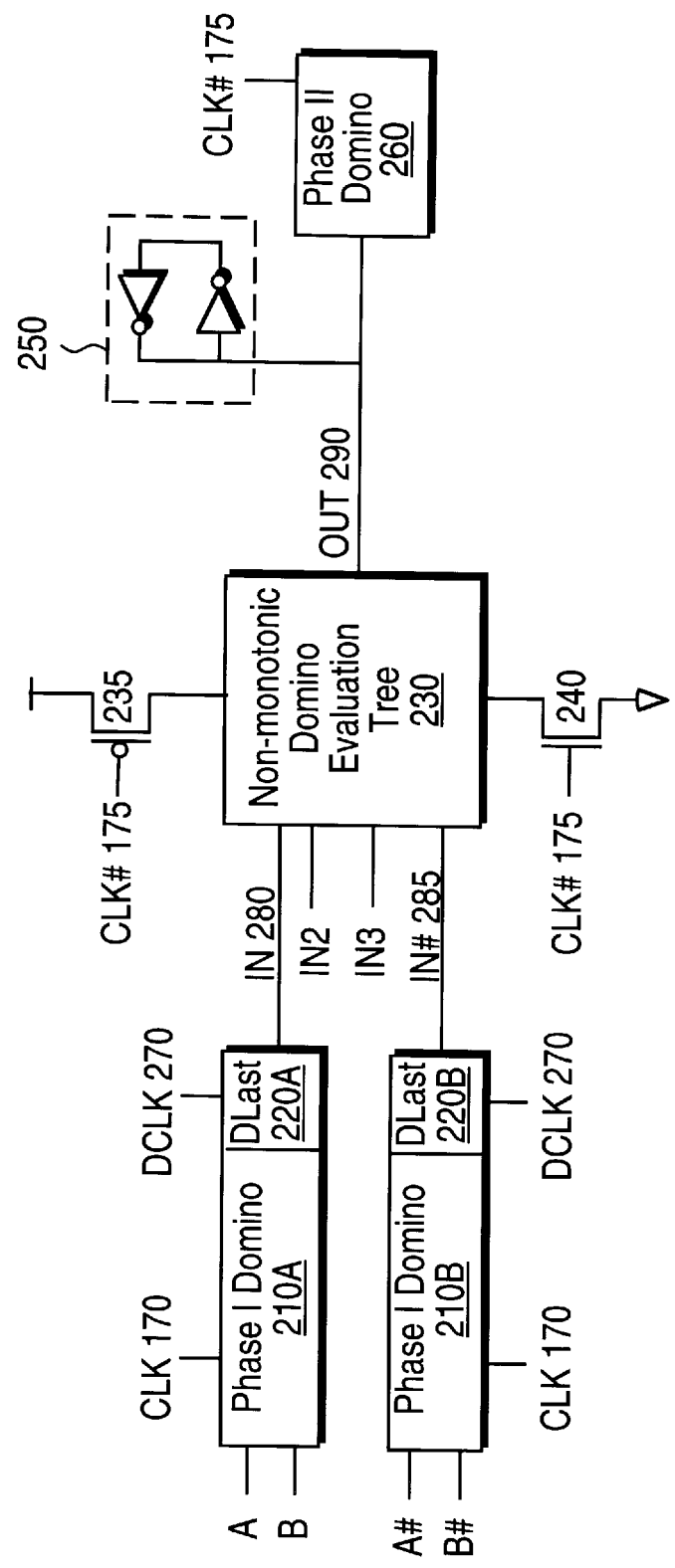
FIG. 2A is a block diagram of another prior art implementation of an interface from a monotonic to a non-monotonic domino logic function.
Figure 2B:
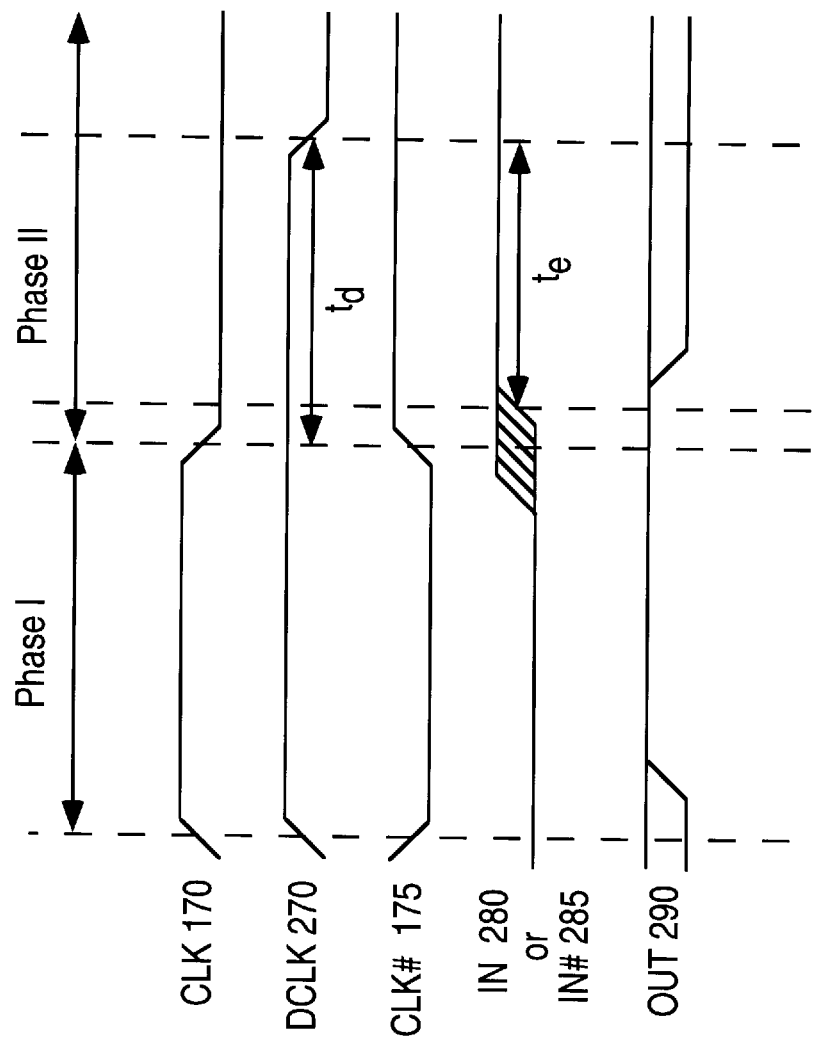
FIG. 2B is a timing diagram of the signals for the circuit illustrated in FIG. 2A.
Figure 3A:
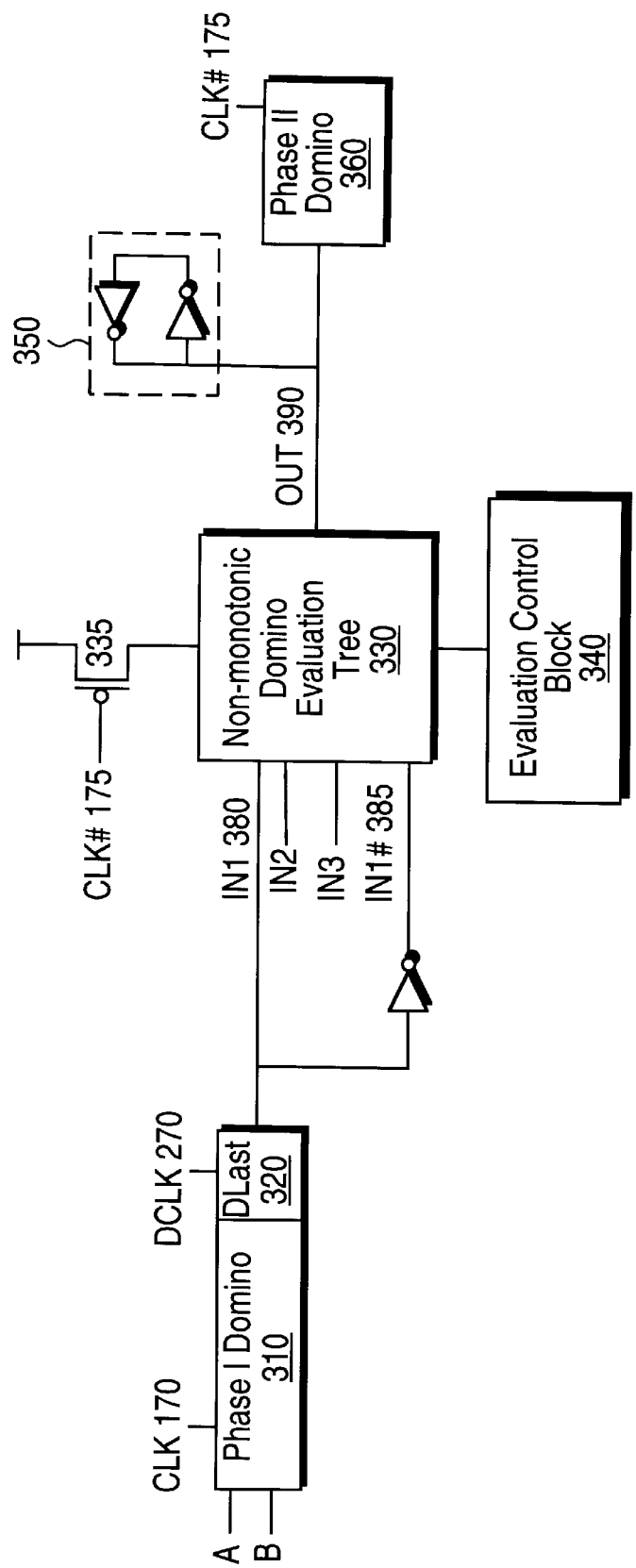
FIG. 3A is a block diagram of an interface from a monotonic to a non-monotonic domino logic function according to the present invention.

FIG. 3A is a block diagram of an interface between a monotonic and a non-monotonic domino logic blocks implemented according to the present invention. Domino logic block 310 includes Dlast 320, the last domino gate. Domino logic block 310 is clocked by a clock signal, CLK 170, while Dlast 320 is clocked by a delayed clock signal, DCLK 270. The output of Dlast 320, the IN signal 380, is coupled to the input of an inverter 330. The output of the inverter 330 is the IN# signal 385. The IN signal 380 and IN# signal 385 are inputs to the non-monotonic domino evaluation tree 330. The non-monotonic domino evaluation tree 330 may optionally have inputs IN2 and IN3, or other complementary input pairs.

The non-monotonic domino evaluation tree 330 is a block of domino logic which may implement one of a number of non-monotonic functions. For example, the non-monotonic domino evaluation tree 330 may implement a sum select function in an adder. A sum select function may be implemented by four NMOS devices. A first and second NMOS device are coupled in series. A third and fourth NMOS device are coupled in series, and connected in parallel with the first and second NMOS devices. The input to the first NMOS device is the IN signal 380, while the input to the third NMOS device is the IN# signal 385. The input to the second NMOS device is a first sum, while the input to the fourth NMOS device is a second sum. Other functions may be similarly implemented.

The non-monotonic domino evaluation tree 330 is coupled to a PMOS precharge transistor 335, which pulls the output of the non-monotonic domino evaluation tree 330, OUT 390, high during the precharge phase, while CLK# signal 175 is low. The non-monotonic domino evaluation tree 330 is also connected to a evaluation control block 340. The non-monotonic domino evaluation tree 330 operates only when the evaluation control block 340 is ON, that is pulling down, and the CLK# signal 175 is high. The OUT signal 390 is prevented from floating by a full keeper 350. In one embodiment, the full keeper 350 includes a pair of cross coupled inverters coupled to the output node of the non-monotonic domino evaluation tree 330. The OUT signal 390 is an input to a Phase II logic block 360.

FIG. 3B is a timing diagram of the signals utilized in the circuit illustrated in FIG. 3A. In one embodiment, the CLK signal 170 is a standard clock signal having a fifty percent duty signal. A typical frequency of the CLK signal 170 might be 500 MHz. The CLK signal 170 may comprise a global reference clock signal which runs at an integrated circuit's internal operating frequency. In FIG. 3B the period of the CLK signal 170 is denoted as T. Phase I is defined as the period during which CLK signal 170 is high, while Phase II is the period during which the CLK signal 170 is low.

The CLK# signal 175 is the complement of the CLK signal 170. The clocking scheme of the present invention further includes the DCLK signal 270, a delayed clock. The DCLK signal 270 has a rising edge which is substantially synchronous with the rising edge of the CLK signal 170. The falling edge of the DCLK signal 270 is delayed with respect to the falling edge of the CLK signal 170. In FIG. 3B the time delay between the falling edge of the CLK signal 170 and the falling edge of the DCLK signal 270 is denoted $t_d$.

The clocking scheme of the present invention further includes the PULSE 370, with a width of $t_p$. The PULSE 370 is the period during which the evaluation control block 340 is ON. As can be seen, the PULSE 370 begins substantially synchronously with the rising edge of the CLK# signal 175. However, the end of PULSE 370 is earlier than the falling edge of the CLK# signal 175. In this way, the evaluation control block 340 is only ON during part of Phase II. The width of the PULSE 370, $t_p$, can be adjusted to a variety of values.

The IN signal 380 and IN# signal 385 are inputs to the non-monotonic domino evaluation tree 330. The IN signal 380 and IN# signal 385 become valid before the end of Phase I, and must remain stable while the evaluation control block 340 is ON. The non-monotonic domino evaluation tree 330 operates during $t_p$ and may pull the OUT signal 390 low. After this window of time the OUT signal 390 is maintained by the full keeper 350. In FIG. 3B this is shown by dashed lines. The OUT signal 390 needs to be kept stable beyond $t_p$ because the Phase II logic block 360 operates during all of Phase II.

The width of the PULSE 370, $t_p$, is greater than the maximum required evaluation time of the non-monotonic domino evaluation tree 330, to make certain that the output of the non-monotonic domino evaluation tree 330 is valid. The period $t_p$ is less than or equal to the period of the delay of DCLK signal 270, $t_d$. Since Dlast 320 is clocked by the DCLK signal 270, Dlast 320 does not start pre-charging until the falling edge of the DCLK signal 270. Thus, the outputs of Dlast 320, IN 380 and IN# 385, remain stable during the period $t_d$. The non-monotonic domino evaluation tree 330 operates only during the period $t_p$, which is less than $t_d$. Therefore, neither latches nor a dual rail implementation of the monotonic logic is needed for a stable input to the non-monotonic domino evaluation tree 330.

Figure 4A:
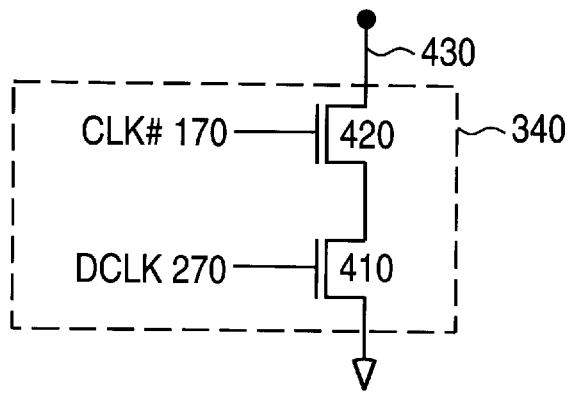
FIG. 4A is a circuit diagram of one embodiment of the evaluation control block of the present invention.
Figure 5A:
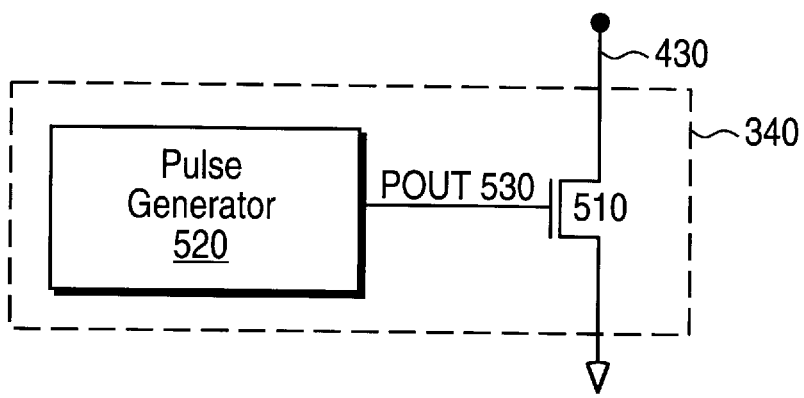
FIG. 5A is a block diagram of another embodiment of the evaluation a control block of the present invention.

An important element of the present invention is the evaluation control block 340. There are many ways to implement such a evaluation control block 340, two of which are illustrated FIGS. 4A and 5A. FIG. 4A utilizes clock signals which are available in OTB domino circuits. FIG. 5A eliminates a transistor from the pull-down path, at the expense of needing a pulse generator.

FIG. 4A is a circuit diagram of one embodiment of the evaluation control block 340. Referring to FIG. 4A, the evaluation control block 340 consists of two N-type MOSFET devices 410 and 420 in series between ground and the output node 430. The first NMOS device 410 is driven by the complementary clock, CLK# 175, while the second NMOS device 420 is driven by a delayed clock, DCLK 270.

Figure 4B:
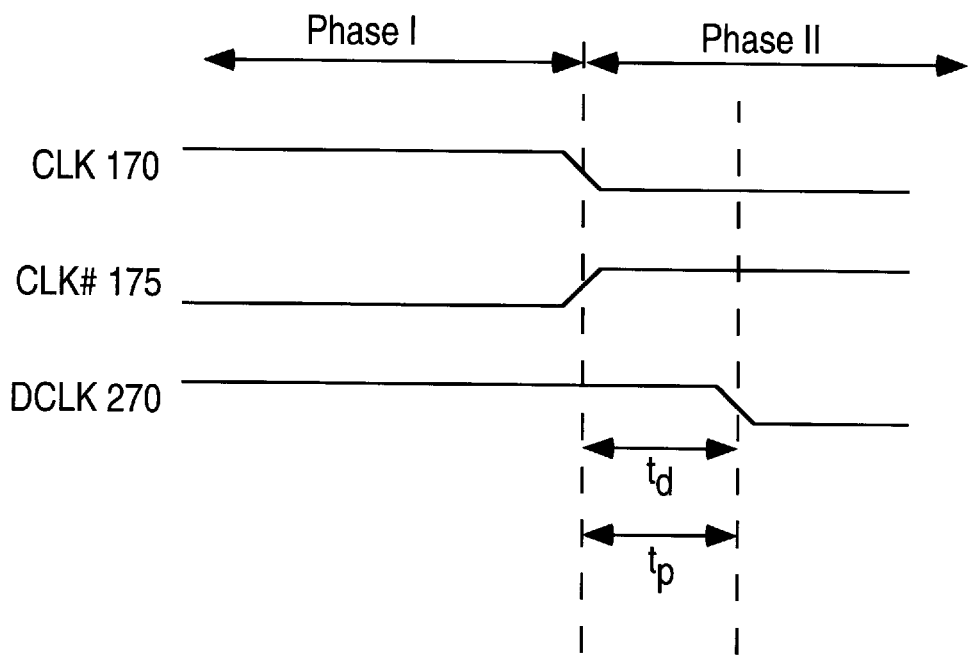
FIG. 4B is a timing diagram of the signals for the circuit illustrated in FIG. 4A.

FIG. 4B is a timing diagram of the signals utilized in FIG. 4A. The CLK signal 170, CLK# signal 175, and DCLK signal 270 are identical to the signals from FIG. 3B, described above. In FIG. 4B the time delay between the falling edge of the CLK signal 170 and the falling edge of the DCLK signal 270 is denoted $t_d$. The DCLK signal 270 is used by OTB domino circuits, thus, it is conveniently available for the present invention. The conditional evaluation window, $t_p$, is the time that both CLK# signal 175 and DCLK signal 270 are high. Thus, the evaluation control block 340 is ON for a period $t_p$, starting at the rising edge of the CLK# signal 175 and ending at the falling edge of the DCLK signal 270. Therefore, in this embodiment, $t_p$ equals $t_d$.

FIG. 5A shows an alternative embodiment of the evaluation control block 340, using only one pull-down transistor. An NMOS device 510 is connected between ground and an output node 430. The NMOS device 510 is driven by the POUT signal 530, the output of a pulse generator 520. The design and use of pulse generators is well known in the art.

Figure 5B:
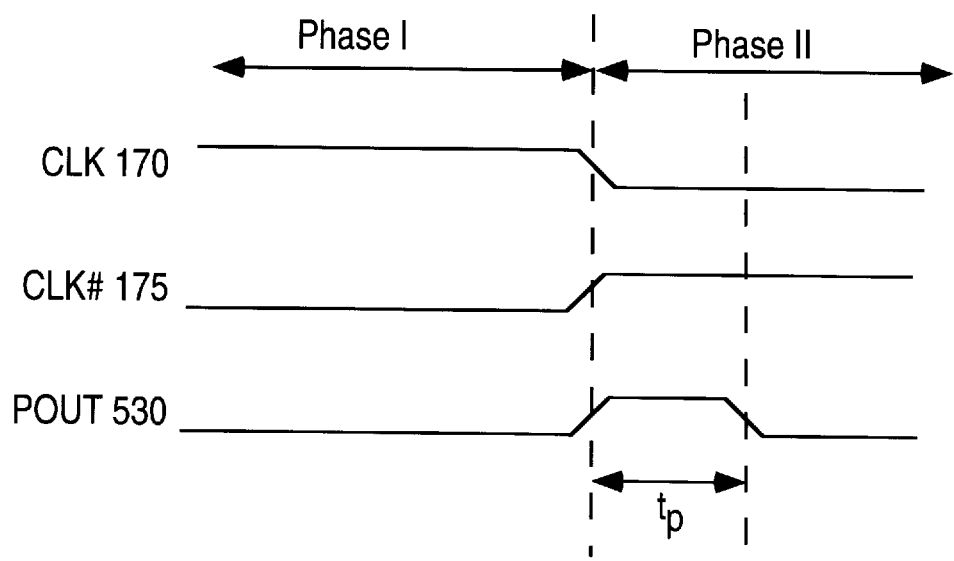
FIG. 5B is a timing diagram of the signals for the circuit illustrated in FIG. 5A.

FIG. 5B shows the timing diagram of the signals used in FIG. 5A. The CLK signal 170 and the CLK# signal 175 are identical to the signals from FIG. 3B, described above. The POUT signal 530 is the output of the pulse generator 520, having a width of $t_p$. While POUT signal 530 is high, the evaluation control block 340 is ON.

In the foregoing specification, the invention has been described with reference to specific embodiments thereof. It will, however, be evident that various modifications and changes may be made thereto without departing from the broader spirit and scope of the invention.

The specification and drawings are, accordingly, to be regarded in an illustrative rather than a restrictive sense. The present invention should not be construed as limited by such embodiments and examples, but rather construed according to the following claims.

What is claimed is:

1. An interface between a monotonic domino logic block and a non-monotonic domino logic block comprising:

a last stage of said monotonic domino logic block, said last stage being clocked by a delayed clock;

a evaluation control block; and the non-monotonic domino logic block having a first input which is an output of the last stage, and having a second input which is an inverted output of said last stage, said non-monotonic domino logic block operating during a window of time when said evaluation control block is ON, said window of time being less than or equal to a delay of said delayed clock.

2. The interface of claim 1 wherein said window of time is longer than a period necessary to evaluate a function implemented by said non-monotonic domino logic block.

3. The interface of claim 1 wherein said evaluation control block comprises:

a first n-type metal oxide semiconductor field effect device (NMOSFET); and a second NMOSFET connected to said first NMOSFET in series.

4. The interface of claim 1 wherein said evaluation control block comprises:

an n-type metal oxide semiconductor field effect device (NMOSFET); and a pulse generator coupled to a gate of said NMOSFET.

5. The interface of claim 1 further comprising a keeper to keep an output of said non-monotonic domino logic block stable.

6. The interface of claim 5, wherein said keeper comprises:

a first inverter; and a second inverter coupled in a series ring with said first inverter, connected to said output of said non-monotonic domino logic block.

7. The interface of claim 1 further comprising a second domino logic block, an input to said second domino logic block being said output of said non-monotonic domino logic block.

8. An interface between a monotonic domino logic block and a non-monotonic domino logic block comprising:

a first clock signal;

a complementary clock signal, said complementary clock signal being a complement of said first clock signal;

a delayed clock signal, said delayed clock signal having a falling edge delayed with respect to said first clock signal;

the monotonic domino logic block clocked by said first clock signal, having a last domino logic block clocked by said delayed clock signal;

the non-monotonic domino logic block, having a first input which is an output of said last domino logic block, and having a second input which is an inverted output of said last domino logic block; and said non-monotonic domino logic block operating during a window of time comprising a time difference between a rising edge of said complementary clock signal and said falling edge of said delayed clock signal.

9. The interface of claim 8 wherein a delay of said delayed clock signal is greater than a period necessary to evaluate a function implemented by said non-monotonic domino logic block.

10. The interface of claim 8 wherein said window of time is less than a delay of said delayed clock signal.

11. The interface of claim 8 wherein said window of time is determined by a evaluation control block comprising:

a first n-type metal oxide semiconductor field effect device (NMOSFET) having its gate coupled to said complementary clock signal; and a second NMOSFET having its gate connected to said delayed clock signal, said second NMOSFET connected in series to said first NMOSFET.

12. The interface of claim 8 further comprising a keeper for keeping said output of said non-monotonic domino logic block stable after said non-monotonic domino logic block ceases to operate.

13. The interface of claim 12, wherein said keeper comprises:

a first inverter; and a second inverter connected with said first inverter in a series ring, connected to said output of said non-monotonic domino logic block.

14. The interface of claim 8 further comprising a second domino logic block, an input to said second domino logic block being said output of said non-monotonic domino logic block.

15. A method of interfacing a monotonic domino logic block and a non-monotonic domino evaluation tree, said method comprising the steps of:

generating a first output of a last block of a first monotonic domino logic block during an extended period, said extended period extending beyond a first clock phase by a delay of a delayed clock;

turning on an evaluation control block for a window of time less than a second clock phase, which is less than or equal to the delay of the delayed clock; and generating a second output of the non-monotonic domino evaluation tree, said first output being an input to said non-monotonic domino evaluation tree, said non-monotonic domino evaluation tree operating while said evaluation control block is on.

16. The method of claim 15 wherein said window of time starts during said second clock phase.

17. The method of claim 15 wherein said window of time is longer than a period for evaluating a function implemented in said non-monotonic domino evaluation tree.

18. The method of claim 15 wherein said window of time is shorter than said extended period.

19. The method of claim 15 further comprising the step of latching said second output by a keeper to keep said second output stable.

20. The method of claim 19 wherein said keeper comprises two inverters coupled in a series ring.

21. The method of claim 15 wherein said step of turning on said evaluation control block comprises:

turning on a first n-type metal oxide semiconductor field effect device (NMOSFET); and turning on a second NMOSFET, said second NMOSFET coupled in series with said first NMOSFET.

22. The method of claim 15 wherein said step of turning on said evaluation control block comprises turning on an n-type metal oxide semiconductor field effect device (NMOSFET), by having its gate connected to a pulse generator, said pulse generator generating a pulse during which said NMOSFET is turned on.

* * * * *